United States Patent [19]
Capasso et al.

[11] Patent Number: 5,978,397
[45] Date of Patent: *Nov. 2, 1999

[54] ARTICLE COMPRISING AN ELECTRIC FIELD-TUNABLE SEMICONDUCTOR LASER

[75] Inventors: Federico Capasso, Westfield; Alfred Yi Cho, Summit; Jerome Faist, Scotch Plains; Albert Lee Hutchinson, Piscataway, all of N.J.; Carlo Sirtori, Paris, France; Deborah Lee Sivco, Warren, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/825,286

[22] Filed: Mar. 27, 1997

[51] Int. Cl.$^6$ .............................. H01S 3/18; H01S 3/10; H01L 29/06
[52] U.S. Cl. .................... 372/45; 372/20; 257/15
[58] Field of Search .................. 372/43–46, 48, 372/20; 257/15, 17

[56] References Cited

U.S. PATENT DOCUMENTS

| | | | |
|---|---|---|---|
| 5,128,728 | 7/1992 | Liu ............................................ | 372/43 |
| 5,289,486 | 2/1994 | Iga et al. .................................. | 372/45 |
| 5,457,709 | 10/1995 | Capasso et al. ........................... | 372/45 |
| 5,502,787 | 3/1996 | Capasso et al. ........................ | 385/123 |
| 5,509,025 | 4/1996 | Capasso et al. ........................... | 372/45 |
| 5,544,187 | 8/1996 | Kadoiwa et al. ......................... | 372/45 |
| 5,574,741 | 11/1996 | Arimoto .................................... | 372/45 |

OTHER PUBLICATIONS

Faist, J. et al., "Quantum Cascade Laser", *Science*, vol. 264, No. 5158, Apr. 22, 1994, pp. 553–556.

Faist, J. et al., "Mid–Infrared Field tunable Intersubband Electroluminescence at Room Temperature by Photon–Assisted Tunneling in Coupled–Quantum Wells", *Applied Physics Letters*, vol. 64, No. 9, Feb. 28, 1994, pp. 1144–1146.

Sirtori, C. et al., "Quantum Cascade Laser With Plasmon–Enhanced Waveguide Operating at 8.4 μm Wavelength", *Applied Physics Letters*, vol. 66, No. 24, Jun. 12 1995, pp. 3242–3244.

Kazarinov, R. F. et al., "Possibility of the Amplification of Electromagnetic Waves In A Semiconductor With a Superlattice" *Soviet Physics Semiconductors*, vol. 5, No. 4, Oct. 1971, pp. 707–709.

Susa, Nobuhiko, "Design of Double and Triple Quantum Wells for InGaAs–AIAsSb Intersubband Unipolar Semiconductor Lasers", *IEEE J. of Quantum Electronics*, vol. 32, No. 1, Jan. 1996, pp. 20–28.

Martinelli, R. U., "Mid–infrared wavelengths enhance trace gas sensing", *Laser Focus World*, Mar. 1996, pp. 77–81.

Faist, J. et al., "Laser action by tuning the oscillator strength", *Nature*, vol. 387, Jun. 19, 1997, pp. 777–782.

"Lasers Without Inversion: Interference of Lifetime–Broadened Resonances", by S. E. Harris, *Physical Review Letters*, vol. 62, No. 9, Feb. 27, 1989, pp. 1033–1036.

(List continued on next page.)

Primary Examiner—Rodney Bovernick
Assistant Examiner—Qu Yen Phan Leung
Attorney, Agent, or Firm—Eugen E. Pacher

[57] ABSTRACT

In a novel tunable semiconductor laser, the lasing transition is a non-resonant tunneling transition, with the frequency of the emitted photon depending on the electrical bias across the multi-period active region of the laser. The laser can be designed to emit in the mid-IR, and can advantageously be used for, e.g., trace gas sensing.

11 Claims, 5 Drawing Sheets

OTHER PUBLICATIONS

"Semiconductor Lasers Without Population Inversion", by Imamoglu et al., *Optics Letters*, vol. 19, No. 21, Nov. 1, 1994, pp. 1744–1746.

"Possibility of the Amplification of Electromagnetic Waves in a Semiconductor with a Superlattice", by R.F. Kazarinov et al., *Soviet Physics–Semiconductors*, vol. 5, No. 4, Oct. 1971, pp. 707–709.

"Electric and Electromagnetic Properties of Semiconductors with a Superlattice", by R.F. Kazarinov, *Soviet Physics–Semiconductors*, vol. 6, No. 1, Jul. 1972, pp. 120–131.

"Mid–infrared Wavelengths Enhance Trace–gas Sensing", by R. U. Martinelli, *Laser Focus World*, Mar. 1996, pp. 77–81.

"Quantum Cascade Laser", by J. Faist et al., *Science*, vol. 264, Apr. 22, 1994, pp. 553–556.

"Vertical Transition Quantum Cascade Laser with Bragg Confined Excited State", by J. Faist, *Applied Physics Letters*, vol 66 (5), Jan. 30, 1995, pp. 538–540.

"Continuous Wave Operation of a Vertical Transition Quantum Cascade Laser Above T=80 K", by J. Faist, *Applied Physics Letters*, vol. 67 (21), Nov. 20, 1995, pp. 3057–3059.

"Continouous Wave Operation of Midinfrared (7.4–8.6 $\mu$m) Quantum Cascade Lasers up to 100 K Temperature", by C. Sirtori, *Applied Physics Letters*, vol. 68 (13), Mar. 25, 1996, pp. 1745–1747.

"Long Wavelength Infrared ($\lambda$~11 $\mu$m) Quantum Cascade Lasers", by C. Sirtori, *Applied Physics Letters*, vol. 69 (19), Nov. 4, 1996, pp. 2810–2812.

"High Power Mid–infrared ($\lambda$~5 $\mu$m) Quantum Cascade Lasers Operating Above Room Temperature", by J. Faist, *Applied Physics Letters*, vol. 68 (26), Jun. 24, 1996, pp. 3680–3682.

FIG. 13

ARTICLE COMPRISING AN ELECTRIC FIELD-TUNABLE SEMICONDUCTOR LASER

FIELD OF THE INVENTION

This invention pertains to semiconductor lasers.

BACKGROUND

In conventional lasers the lasing threshold is achieved when the population difference between the initial and final states of the lasing transition reaches a critical value determined by the equality between gain and optical losses. In such lasers, lasing requires population inversion. This generally is achieved by optical or electrical pumping.

However, lasers without population inversion have been proposed. For instance, S. E. Harris, *Physical Review Letters*, Vol. 62(9), p. 1033 (1989), shows on theoretical grounds that under certain conditions that include interference between lifetime-broadened discrete levels which decay to the same continuum, lasing without population inversion may be possible in extreme UV and X-ray laser systems, or in systems that comprise artificially layered materials. A. Imamoglu et al., *Optics Letters*, Vol. 19(21), p. 1744 (1994) propose another scheme for lasing without population inversion. The scheme utilizes interferences in double-quantum well intersubband transitions. Neither publication offers experimental verification. See also R. F. Kazarinov et al., *Soviet Physics Semiconductors*, Vol. 5, p. 707 (1971), and R. F. Kazarinov et al., *Soviet Physics Semiconductors*, Vol. 6, p. 120 (1972), which disclose the possibility of the amplification of electromagnetic waves in a semiconductor structure with a superlattice. The structure proposed by Kazarinov et al. is subject to field break-up into field domains, and electromagnetic wave amplification has not been observed in the proposed structure.

It would be highly desirable to have available a tunable laser in the mid-IR wavelength range (e.g. about 3–13 $\mu$m), due to the existence of atmospheric transmission windows at 3–5 $\mu$m and 8–13 $\mu$m. Many gases and vapors have pronounced absorption features in these wavelength regions, and thus could readily be detected. Such a tunable laser could be advantageously used for trace-gas sensing for, e.g., environmental, industrial or medical applications. See, for instance, U. Martinelli, *Laser Focus World*, March 1996, p. 77.

Recently, a new class of lasers, designated "quantum cascade" or "QC" lasers, was disclosed. See U.S. Pat. Nos. 5,457,709 and 5,509,025. See, for instance, also J. Faist et al., *Science*, Vol. 264, p. 553 (1994); J. Faist et al., *Applied Physics Letters*, Vol. 66, p. 538 (1995); J. Faist et al., *Applied Physics Letters*, Vol. 67, p. 3057 (1995); C. Sirtori et al., *Applied Physics Letters*, Vol. 68, p. 1745 (1996); C. Sirtori et al., *Applied Physics Letters*, Vol. 69, p. 2810 (1996); and J. Faist et al., *Applied Physics Letters*, Vol. 68, p. 3680 (1996). All of the above are incorporated herein by reference. The operating wavelength of a QC laser can be tailored over a wide range of wavelengths (including wavelengths in the mid-IR range) by controlling layer thickness in the multilayer semiconductor structure. QC lasers utilize intersubband population inversion to achieve lasing, with the lasing wavelength substantially not being electric field tunable.

In view of the potential advantages of an electric field-tunable semiconductor laser, especially one that is capable of operation in the mid-IR wavelength regime, it would be highly desirable to have available such a laser. This application discloses such a laser, the laser utilizing a novel mechanism to establish population inversion.

SUMMARY OF THE INVENTION

In a broad aspect the invention is embodied in an article (e.g., a trace gas detection or analysis system) that comprises an electric field-tunable semiconductor laser, or in an electric field-tunable semiconductor laser. Exemplarily the laser emits in the mid-IR spectral region, with a wide tuning range (e.g., more than 50 cm$^{-1}$).

More specifically, the laser comprises a first and a second contact region for applying an electrical bias across a semiconductor structure. The semiconductor structure comprises an active region, with the active region comprising, in sequence in a direction normal to said contact regions, a multiplicity of essentially identical repeat units, with each repeat unit comprising a multiplicity of layers.

Significantly, the multiplicity of layers of the repeat units is selected such that the lasing transition of the laser is a non-resonant tunneling transition of a charge carrier (typically an electron) from a first quantum state to a second quantum state, the transition being accompanied by emission of a photon of energy hv, where h is Planck's constant and v is the photon frequency. The photon frequency is a function of the electrical bias applied across the semiconductor structure. The laser thus is electric field-tunable. Preferred embodiments comprise a segmented electrode.

DETAILED DESCRIPTION OF A PREFERRED EMBODIMENT

Figure 1:
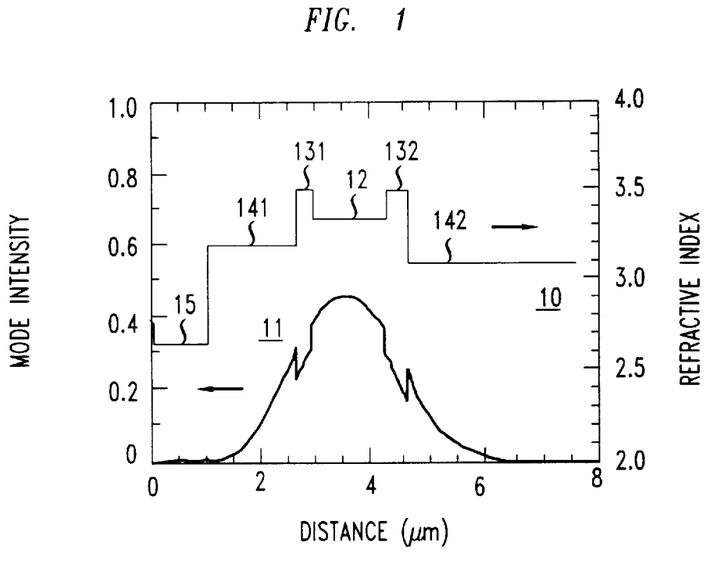
FIG. 1 schematically shows the refractive index and the mode intensity of an exemplary laser according to the invention.

FIG. 1 schematically depicts the refractive index profile 10 and mode intensity 11 of a laser according to the invention, along the direction normal to the layer structure, from the top contact to the InP substrate. Numeral 12 refers to the active region, numerals 131 and 132 refer to mode confinement enhancement layers that constitute, together with active region 12, the core of the waveguiding structure.

Numerals 141 and 142 refer to upper and lower cladding, respectively, with the lower cladding being the InP substrate. Numeral 15 refers to an optional (but preferred) plasmon confinement layer (see U.S. Pat. No. 5,502,787).

Table I shows the layer structure of the laser of FIG. 1 in detail. "InGaAs" refers to $In_{0.53}Ga_{0.47}As$, and "AlInAs" refers to $Al_{0.48}In_{0.52}As$. "Graded" indicates compositional grading to provide a smooth transition between two semiconductor compositions.

TABLE I

| | | |
|---|---|---|
| InGaAs | $n = 1 \times 10^2$ cm$^{-3}$ | 10 nm |
| Graded | $n = 7 \times 10^{18}$ | 30 |
| AlInAs | $n = 7 \times 10^{18}$ | 1000 |
| | $2 \times 10^{17}$ | 1600 |
| | $1 \times 10^{18}$ | 10 |
| Graded | $n = 7 \times 10^{17}$ | 30 |
| InGaAs | $n = 6 \times 10^{16}$ | 300 |
| Active Region | | (35x) |
| | | 1284 |
| See Table II | | |
| InGaAs | $n = 1 \times 10^{17}$ | 300 |
| Graded | $n = 2 \times 10^{17}$ | 25 |
| InP | $n = 2 \times 10^{17}$ | |

The waveguiding structure of the laser of FIG. 1 closely resembles that of prior art QC lasers. However, the active region of a laser according to the invention differs in fundamental aspects from the active region of QC lasers, as will become apparent.

Figure 2:
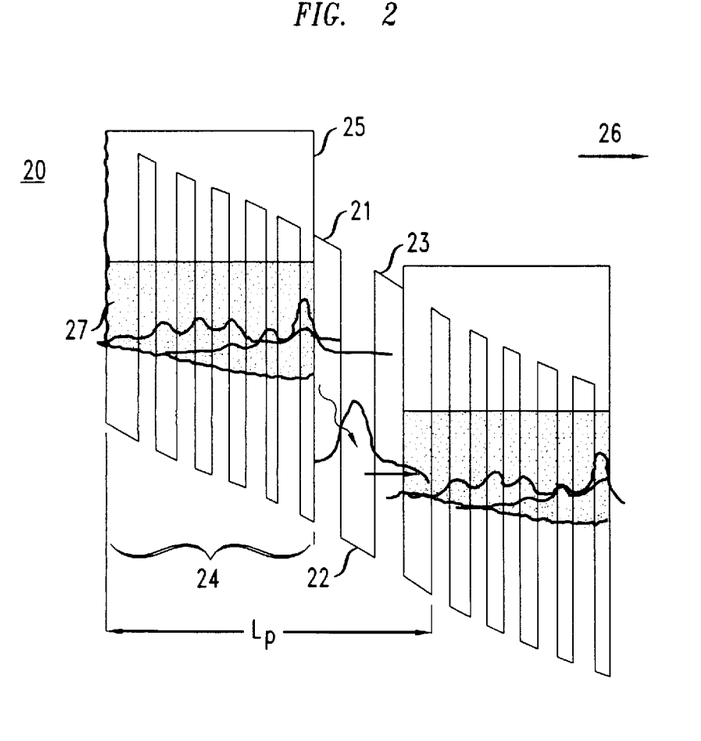
FIG. 2 schematically shows the conduction band edge of a portion of the active region of the laser of FIG. 1.

FIG. 2 schematically shows the conduction band edge of a relevant portion of the active region of the laser of FIG. 1. The active region consists of a multiplicity (e.g., 35) of essentially identical repeat units 20 of thickness $L_p$. For the sake of definiteness, consider a repeat unit to extend from the upstream end of short-period superlattice 24 to the downstream end of second tunneling barrier 23, as shown in FIG. 2. Arrow 26 indicates the downstream direction. A repeat unit further comprises a quantum well 22 and first tunneling barrier 21. The short period superlattice forms a compositionally graded ("trapezoidal") well that provides a tapered miniband (the shaded region 27 of the repeat unit) and a minigap 25. Short period superlattices (also referred to as "pseudo-alloys") are known, as is the fact that such superlattices can be designed to provide an energy region in which carriers can be transmitted through the superlattice (the "miniband"), and/or an energy region in which carriers can not be transmitted through the superlattice (the "minigap"). FIG. 2 also shows the modulus of some relevant wavefunctions, as well as arrows that indicate tunneling transitions, to be discussed below. Table II gives the details of the layer structure of a repeat unit, starting with the most upstream quantum well of the short period superlattice 24, and ending with second tunneling barrier 23.

TABLE II

| | | |
|---|---|---|
| InGaAs | undoped | 3.5 nm |
| InAlAs | undoped | 2.3 |
| InGaAs | $n = 4 \times 10^{17}$ | 2.6 |
| InAlAs | $n = 4 \times 10^{17}$ | 2.2 |
| InGaAs | $n = 4 \times 10^{17}$ | 2.0 |
| InAlAs | $n = 4 \times 10^{17}$ | 2.0 |
| InGaAs | undoped | 2.0 |
| InAlAs | undoped | 2.5 |
| InGaAs | undoped | 1.8 |
| InAlAs | undoped | 2.7 |
| InGaAs | undoped | 1.9 |
| InAlAs | undoped | 3.5 (injection barrier) |

TABLE II-continued

| | | |
|---|---|---|
| InGaAs | undoped | 4.4 |
| InAlAs | undoped | 3.3 |

Figure 3:
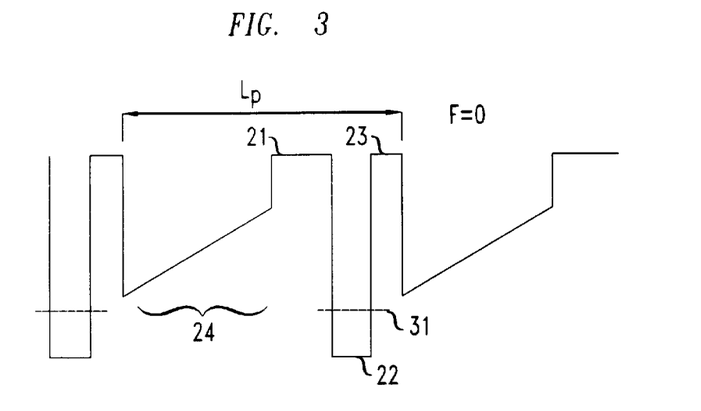
FIGS. 3–5 schematically show the conduction band edge of a portion of the active region of the laser of FIG. 1, for zero bias, moderate bias, and above threshold bias.
Figure 4:
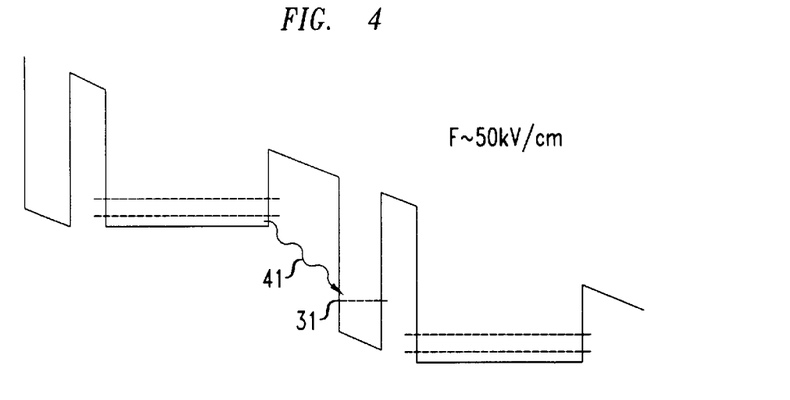
Figure 5:
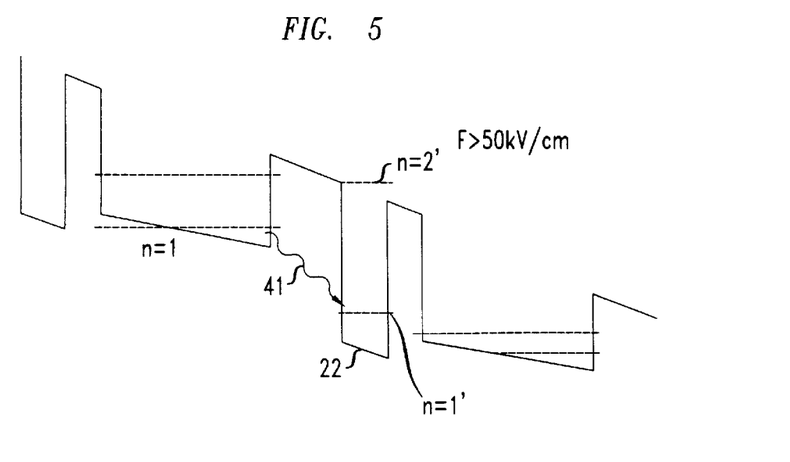

FIGS. 3–5 schematically show the conduction band edge of a repeat unit and of part of its adjacent downstream repeat unit, for zero bias, moderate bias, and above threshold bias, respectively. In FIGS. 3–5, "F" is the bias field across the laser. F=50 kV/cm corresponds to a bias per repeat unit of about 0.18V, for the laser of FIG. 1.

Numerals 21–24 refer to the first tunneling barrier, quantum well, second tunneling barrier and trapezoidal well, respectively. Numeral 31 refers to the ground state level of the quantum well. At zero and low applied electrical bias, graded region 24 provides a thick effective barrier between level 31 and the corresponding downstream level (not shown), and current flow through the structure is negligible.

A significant current starts to flow through the structure only for moderate applied bias, exemplarily ~50 kV/cm. For the laser of FIGS. 1 and 2, this is the bias that is necessary to compensate the conduction band gradient of opposite sign in the trapezoidal wells 24, to form a well with substantially "flat" bottom. Arrow 41 indicates photon-assisted tunneling of carriers from the lowest state of the graded well to level 31. Tunneling through second barrier 23 into the adjacent downstream graded well is rapid, due to resonance with the miniband, as is decay to the lowest energy level thereof.

For still higher applied bias (e.g., >50 kV/cm) the energy states are similar. However, in this bias regime, the tunneling rates and oscillator strength are strongly bias dependent.

For bias in excess of the "flat field" bias of FIG. 4, the ground state (n=1) of the graded well (also referred to as "injector") is energetically far away from the ground state n=1' and excited state n=2' of the quantum well 22. This prevents resonant tunneling into the quantum well and the attendant negative differential resistance. The carrier transport to the quantum well and the downstream repeat unit thus is largely phonon-assisted tunneling between n=1 and n=1', and tunneling from n=1' to the adjacent downstream graded well. This insures stable injection without high field domains in the whole operating range of the novel laser, thereby overcoming a shortcoming of the resonant tunneling optical amplifier structure proposed by R. Kazarinov et al. (op. cit.).

In the operating range of our novel laser, the compositionally graded region 24 forms a "triangular" well (see FIG. 5), the ground state (n=1) of which contains most of the carrier (typically electron) population (typically >95%). The carriers in n=1 have long lifetime (typically tens of picoseconds), as compared to other energy states (e.g., n=1') in the structure, which typically have lifetime of order 1 ps or less. Consequently, the carrier population of state n=1 is substantially constant over a wide range of applied electric field and/or temperature. As can be seen from Table II, charge carriers are provided by selective doping of some of the layers of region 24.

The laser transition (n=1 to n=1') is based on photon assisted tunneling, as indicated by arrow 41 in FIG. 5. The energy (hv) and matrix element of the laser transition can be strongly tuned by application of a bias field across the structure. The energy is hv (h is Planck's constant, v is the photon frequency) and the matrix element $Z_{1,1'}$ is $<\Psi_1|z|\Psi_{1'}>$ where $\Psi_1$ and $\Psi_{1'}$ are the wave functions of the n=1 and n=1' states, respectively, and z is the spatial coordinate normal to the layer structure. The notation used to express the matrix element is conventional and well understood in the art. The oscillator strength ($f_{1,1'}$) of the lasing transition is $(4\pi^2 m_o/h^2)|Z_{1,1'}|^2$ hv, where $m_o$ is the free electron mass.

As can be seen from the above, the oscillator strength of the lasing transition is proportional to the energy of the transition and the modulus squared of the matrix element of the transition. The dependence of the oscillator strength on the applied bias is considered to be due to two mechanisms. Firstly, the transition energy increases, with increasing bias, due to the increase in potential drop between the two states (linear Stark effect). Secondly, the transition matrix element is correspondingly increased, due to enhanced spatial overlap (tunneling) between the states.

When the oscillator strength (and the attendant gain cross section $\sigma_{1,1'}$, which is proportional to the oscillator strength) is such that the gain $\sigma_{1,1'} n_1$ ($n_1$ is the carrier density in n=1) equals the optical losses in the laser cavity, lasing threshold is achieved. Further increasing the bias voltage results in increasing laser output.

The above discussion of the operating mechanism was provided for tutorial reasons only, and the invention does not depend on the correctness of the proposed mechanism.

The operating principle of the novel laser is a very general one, substantially relying on tunneling and the Stark effect. Thus, the novel laser is not limited to implementation in III/V semiconductor material or operation in the mid-IR. For instance, it can be implemented in non-polar materials (e.g., Si—Ge alloys where resonant optical phonon scattering can not be implemented), and it can be designed for operation in the far-IR (e.g., 30–300 $\mu$m) spectral region.

A layer structure as described above was grown by MBE on an InP wafer. The lasers were processed into ridge waveguides aligned along the [1$\overline{1}$0] crystallographic direction by wet chemical etching ($H_3PO_4:H_2O_2:H_2O$ 1:2:4). The etching automatically stopped at the interface with the InP substrate to form trapezoidal-shaped waveguides of width 10–18 $\mu$m at their base. A 350 nm thick $Si_3N_4$ insulation was deposited by chemical vapor deposition. Non-alloyed Ti/Au ohmic contacts were evaporated on the top layer and the substrate. The lasers were cleaved into 1–3.5 mm long bars, and the facets left uncoated. The lasers were then soldered, epi-layer up, on Cu sample holders, wire bonded and mounted on a temperature-controlled (10–300 K) cold head of a He flow cryostat, and measurements were made.

Figure 6:
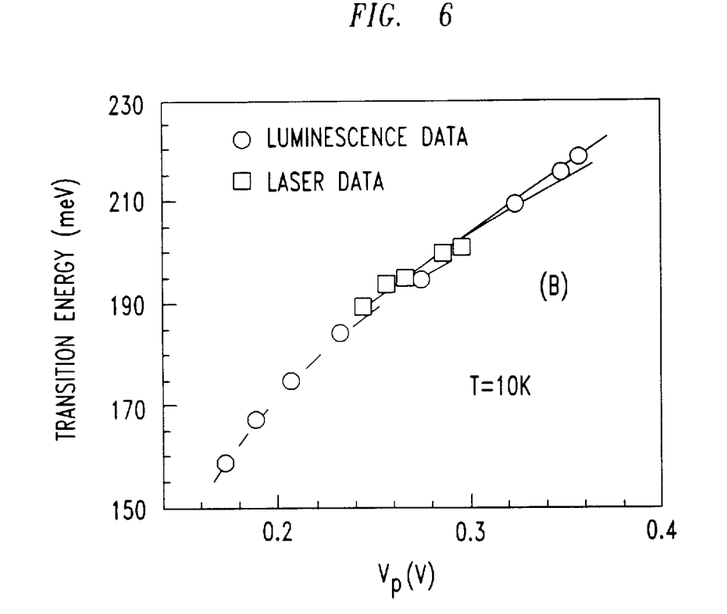
FIG. 6 shows transition energy vs. bias voltage per active region period for an exemplary laser according to the invention.

FIG. 6 shows electroluminescence data and laser data of transition energy vs. bias voltage per active region period ($V_p$), and demonstrates the strong dependence of the laser frequency on the bias voltage. The agreement of laser energies and electroluminescence data is evidence of lasing by oscillator strength tuning.

Figure 7:
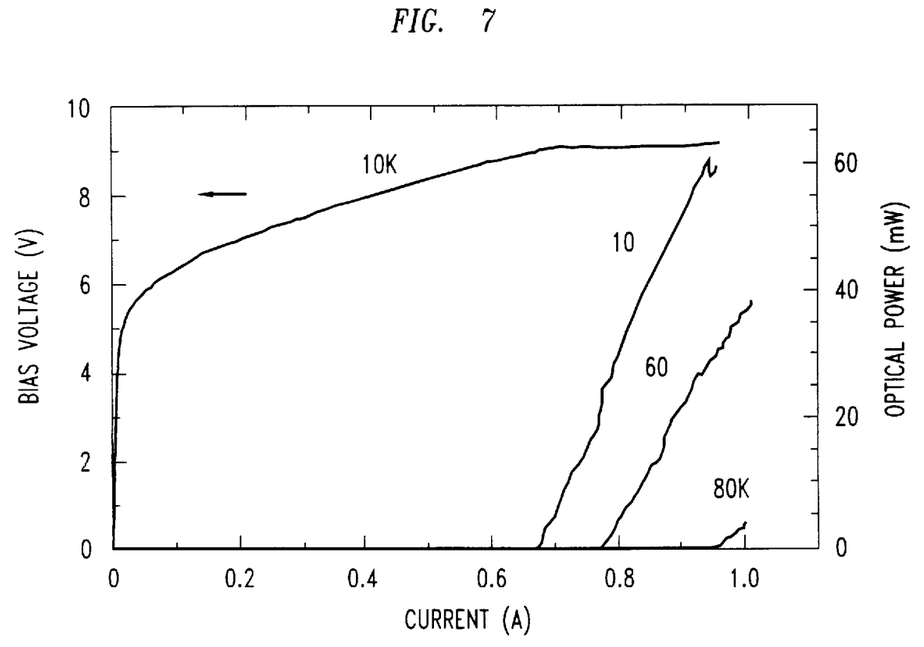
FIG. 7 shows optical power vs. bias current, and bias voltage vs. bias current, both for the above exemplary laser.

FIG. 7 shows continuous wave (cw) optical power from a single laser facet vs. drive current. The laser was 3 mm long and 14 $\mu$m wide. We used f/0.8 optics and a calibrated, room temperature HgCdTe detector. At 10 K, lasing threshold was obtained at 0.675 A (corresponding to a threshold current density of 1.6 kA/cm$^2$). The laser operated up to 80 K, with up to 40 mW of optical power at 60 K. FIG. 7 also shows voltage as a function of injection current at 10 K. The threshold voltage is 9V. Above threshold, the gain is equal to the total optical losses, pinning the bias voltage at approximately its threshold value, as shown experimentally by the plateau in the voltage-current curve above 0.675 A in FIG. 7. Because of this pinning, the laser wavelength does not change significantly as a function of current above threshold. However, because of the strong dependence of the transition energy on the current, the laser wavelength is expected to vary considerably with threshold current density in devices of different cavity length. More specifically, since the threshold current depends on the total loss, the laser photon energy which is a linear function of voltage will typically vary for devices with different mirror and waveguide loss.

Figure 8:
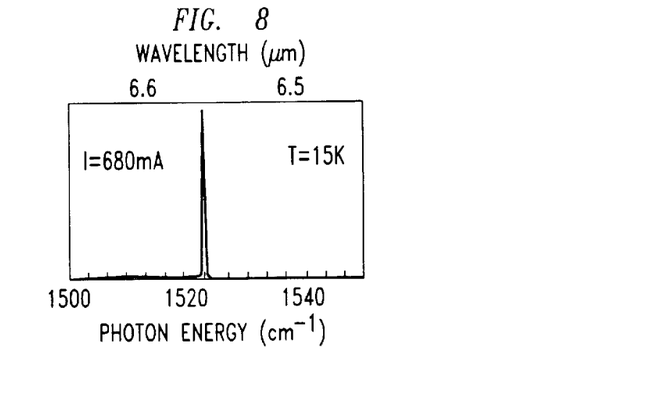
FIG. 8 shows the emission spectrum of the above exemplary laser.

FIG. 8 shows the spectrum of a laser operating in CW just above threshold at 10 K. The spectrum is monomode, with a linewidth limited by spectrometer resolution.

The above described exemplary laser operated in pulse mode up to about 220 K with weak temperature dependence of the threshold current. Another laser, having 45 active region periods, lased at 280 K with tens of milliwatts of pulsed optical power.

Figure 9:
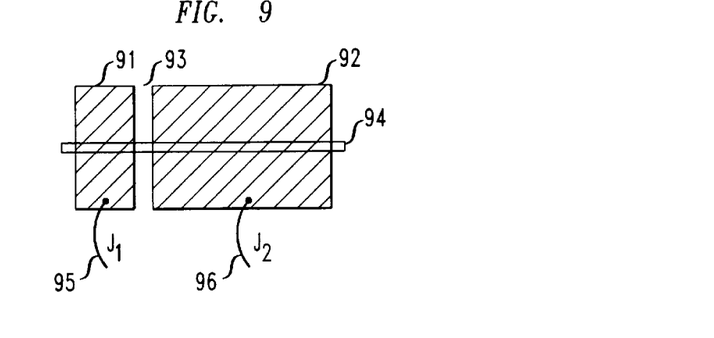
FIG. 9 schematically shows a 2-segment laser according to the invention.
Figure 10:
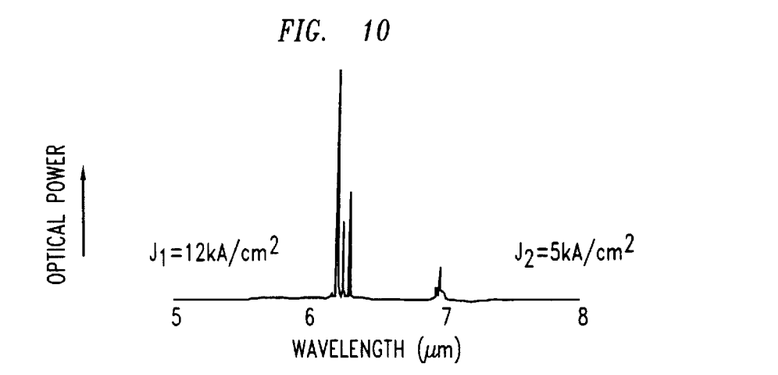
FIG. 10 shows the emission spectrum of an exemplary 2-segment laser according to the invention.

The top contact metallization need not be continuous along the whole waveguide but can be divided into segments. The segments can be contacted in parallel, as shown schematically in FIG. 9, wherein numerals 91–92 designate a first and a second contact segment, 93 designates the gap between the segments, 94 designates the laser mesa, and 95–96 refer to contact wires. If the two segments have considerably different lengths (e.g., ratio of at least 1:2), then the structure is able to lase at two wavelengths simultaneously. FIG. 10 shows optical power as a function of wavelength for a segmented laser, having segment lengths of 0.8 and 2.8 mm, respectively, with 20 $\mu$m separation. The data were taken at threshold.

Figure 12:
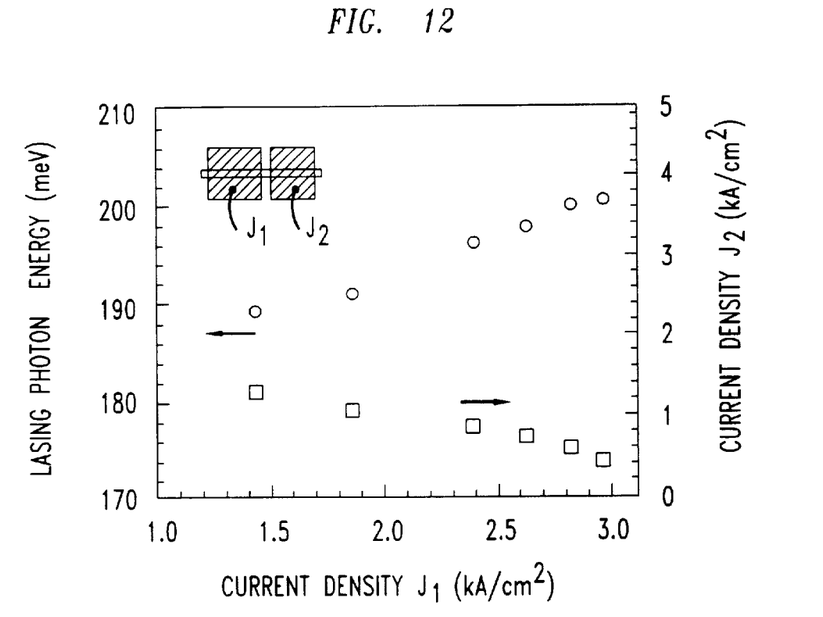
FIG. 12 shows lasing photon energy and current density $J_2$ as a function of current density $J_1$ for an exemplary laser with segmented contact.
Figure 13:
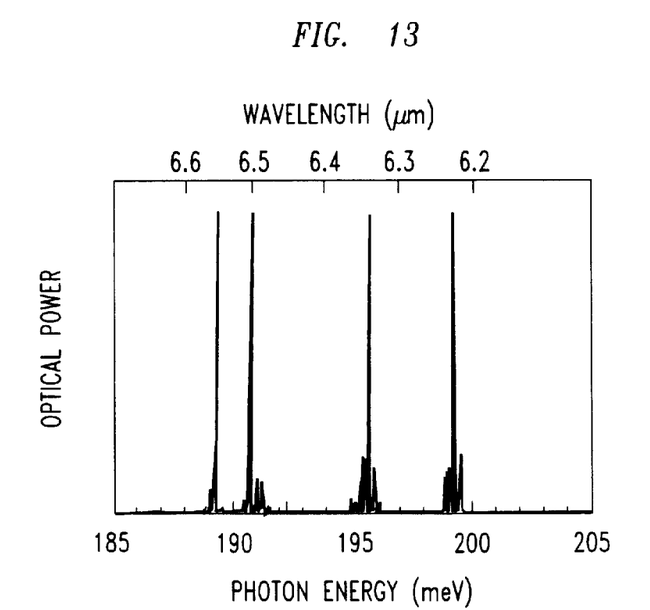
FIG. 13 shows the emission spectrum of the laser of FIG. 12 for different values of $J_1$ and $J_2$.

The situation is different if the contact segments are substantially of equal length. As illustrated in FIGS. 12 and 13, the use of substantially equal length segments (e.g., length ratio less than 1:2) facilitates wavelength tuning. FIG. 12 shows laser photon energy as a function of the injected current density ($J_1$) in the first contact segment, and also shows current density ($J_2$) in the second contact segment, all for a laser as described above, but with segmented top contact, with equal length segments, with 20 $\mu$m gap between the segments, as schematically depicted in the inset of FIG. 12.

FIG. 13 shows measured optical spectra for the laser of FIG. 12, for different values of $J_1$ and $J_2$. For increasing photon energy, the values of $J_1$ and $J_2$ were, respectively, 1.4 and 1.4 kA/cm$^2$, 1.9 and 1.1 kA/cm$^2$, 2.4 and 0.9 kA/cm$^2$, and 2.8 and 0.6 kA/cm$^2$. As can be seen from FIG. 13, the tuning range for this laser was about 6.6–6.2 $\mu$m, corresponding to about 100 cm$^{-1}$. Such a tuning range is advantageous for applications such as pollution monitoring.

Those skilled in the art will appreciate, in a laser according to the invention with segmented electrode, the pinning of the gain to its threshold value is only a global requirement, i.e., the gain in each laser section can be independently tuned, as long as the total gain is equal to the total losses. By injecting different current densities $J_1$ and $J_2$ in each section, the laser photon energy can be electrically tuned towards larger energies, approximately tracking the peak of the gain spectrum of the section with the larger injected current.

Figure 11:
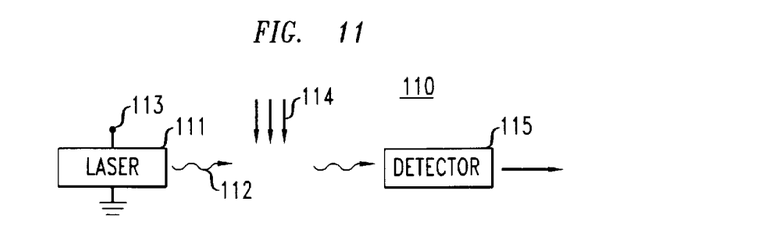
FIG. 11 schematically depicts an exemplary article according to the invention, namely, apparatus for trace gas sensing.

FIG. 11 schematically shows an exemplary article according to the invention, namely, apparatus 110 for trace gas sensing. Laser 111 emits radiation 112 of frequency v selected by electrical bias applied to contact 113. The emitted radiation propagates through a region that contains gas 114, and is then detected by conventional detector 115, the detector output being a function of the nature and concentration of the gas. Desirably, contact 113 is a segmented contact, preferably with segments of substantially equal length.

The invention claimed is:

1. An article comprising a laser comprising a first and a second contact for applying an electrical bias across a semiconductor structure that comprises an active region, the active region comprising, in sequence in a direction normal to said contact regions, a multiplicity of essentially identical repeat units, each repeat unit comprising a multiplicity of layers;

CHARACTERIZED IN THAT
 a) a given repeat unit comprises a short period superlattice and a quantum well disposed between a first and a second barrier layer;
 b) said multiplicity of layers is selected such that a lasing transition of the laser is a tunneling transition of a charge carrier from a first quantum state to a second quantum state, the transition being accompanied by photon emission, the photon energy being hv, where h is Planck's constant and v is the photon frequency, the first quantum state being a ground state of the superlattice, and the second quantum state being a ground state of the quantum well; and
 c) the photon frequency is a function of the electrical bias applied across the semiconductor or structure.

2. Article according to claim 1, wherein the semiconductor structure is a III/V semiconductor structure.

3. Article according to claim 1, wherein the photon frequency is in a frequency range that includes the mid infrared frequencies.

4. Article according to claim 1, wherein the laser has a tuning range of more than 50 $cm^{-1}$.

5. Article according to claim 1, wherein one of the first and second contacts is a segmented contact.

6. Article according to claim 5, wherein the segmented contact comprises a first and a second segment, with said first and second segments having a length ratio of less than 2:1 selected to facilitate electrical bias tuning of the laser frequency.

7. Article according to claim 5, wherein the segmented contact comprises a first and a second segment, with said first and second segments having a length ratio of at least 2:1 selected to facilitate simultaneous lasing at two or more distinct photon frequencies.

8. Article according to claim 1, wherein the semiconductor structure comprises a plasmon confinement layer.

9. Article according to claim 1, wherein the semiconductor structure comprises a mode confinement enhancement layer.

10. Article according to claim 9, wherein the semiconductor structure further comprises a plasmon confinement layer.

11. Article according to claim 1, further comprising a detector for detecting radiation of frequency v from the laser.

* * * * *